(12) United States Patent
Mori

(10) Patent No.: US 7,217,934 B2
(45) Date of Patent: May 15, 2007

(54) WAFER SCANNING DEVICE

(75) Inventor: Masahumi Mori, Ehime (JP)

(73) Assignee: Sumitomo Eaton Nova Corporation, Tokyo (JP)

( * ) Notice: Subject to any disclaimer, the term of this patent is extended or adjusted under 35 U.S.C. 154(b) by 0 days.

(21) Appl. No.: 11/093,326

(22) Filed: Mar. 30, 2005

(65) Prior Publication Data
US 2005/0218336 A1 Oct. 6, 2005

(30) Foreign Application Priority Data
Mar. 31, 2004 (JP) ............... 2004-103434

(51) Int. Cl.
*G21G 5/00* (2006.01)
(52) U.S. Cl. ............... 250/440.11; 250/492.3; 250/492.21; 250/398
(58) Field of Classification Search ............... None
See application file for complete search history.

(56) References Cited

U.S. PATENT DOCUMENTS 6,163,033 A * 12/2000 Smick et al. .......... 250/441.11

6,559,461 B1 * 5/2003 Seo .................. 250/492.21
2005/0230643 A1 * 10/2005 Vanderpot et al. ...... 250/492.21

FOREIGN PATENT DOCUMENTS

JP         10-326590         12/1998

* cited by examiner

*Primary Examiner*—Jack Berman
*Assistant Examiner*—Zia R. Hashmi
(74) *Attorney, Agent, or Firm*—Friedrich Kueffner

(57) ABSTRACT

The wafer scanning device causes a wafer to scan in a vacuum area and includes a holder 10 to hold a wafer, a ball screw 20 to move the holder 10 to scan, a motor 50 to drive the ball screw 20 and an integrally formed support frame 60. While the holder 10 and the ball screw 20 are installed in the vacuum area, a transmission mechanism offset from the line of travel of the ball screw 20 and the motor 50 are installed in the atmosphere. Thus the wafer scanning device improves responsiveness with respect to the scanning speed control, enhances the uniformity of the scanning speed, has the motor or the like arranged properly and achieves the tilt of a wafer in a most preferable manner.

17 Claims, 13 Drawing Sheets

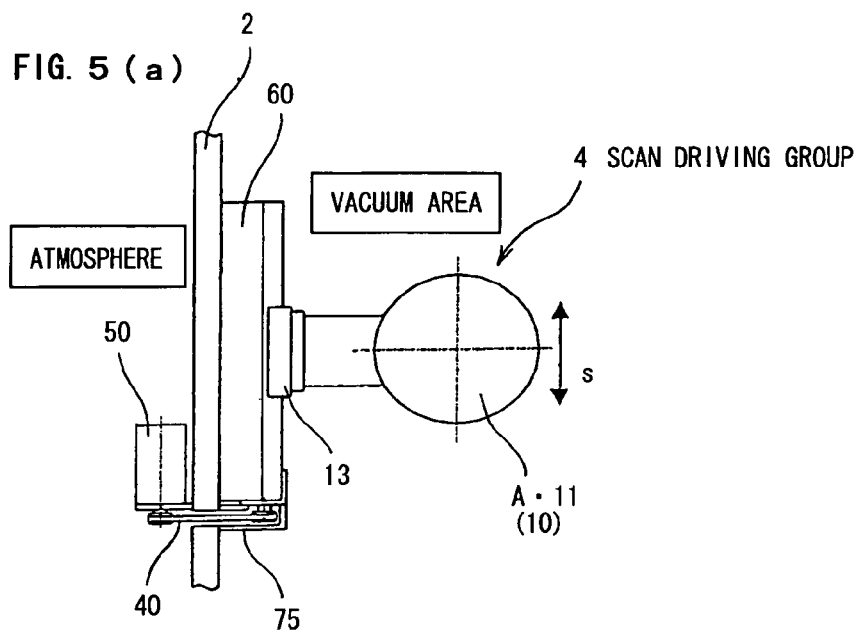
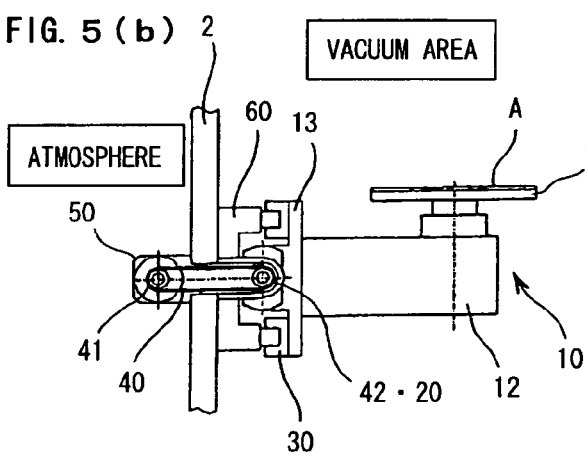
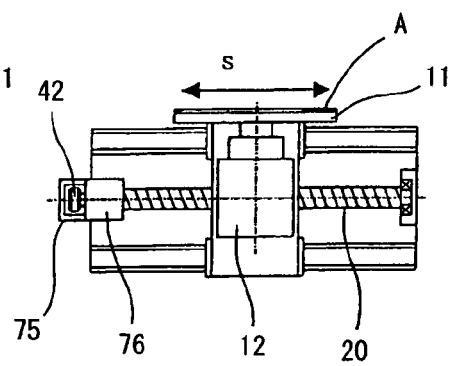

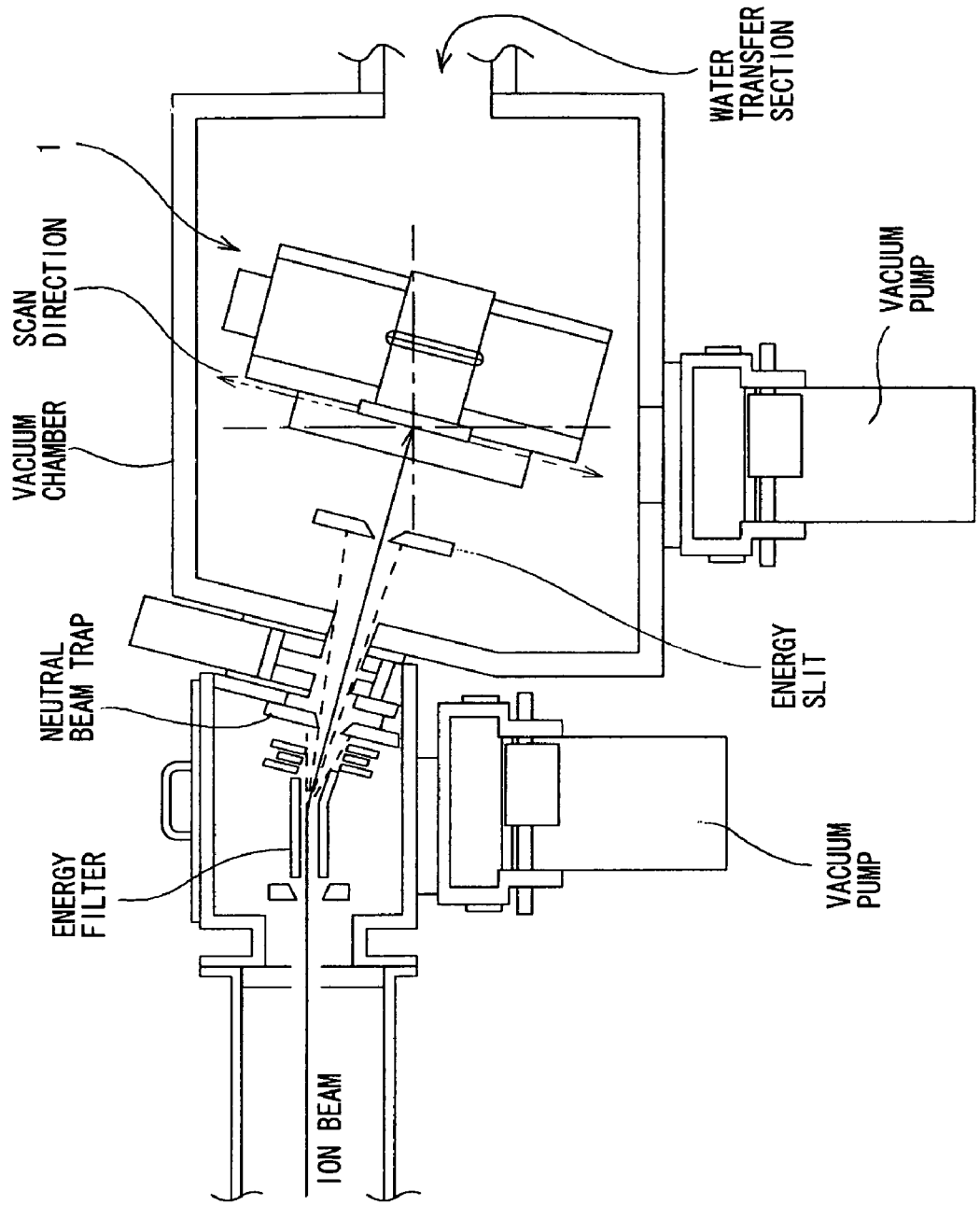

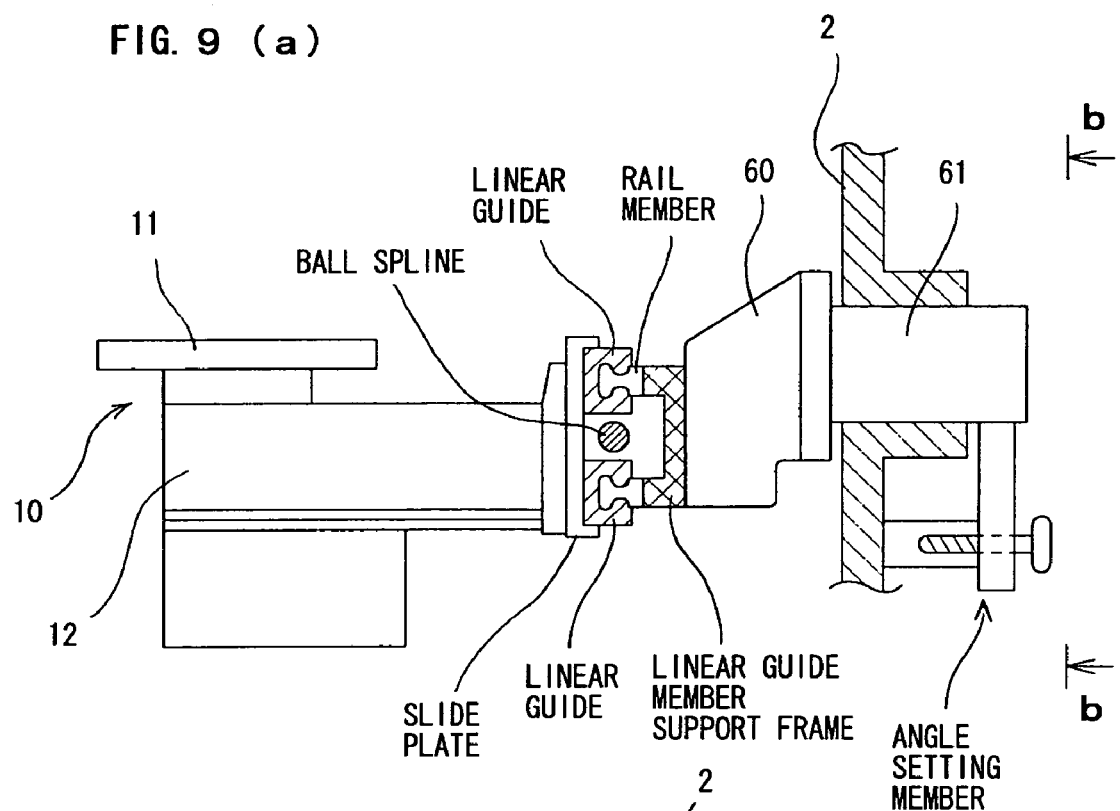
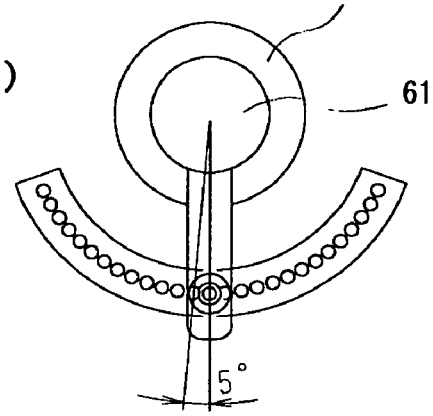

WAFER SCANNING DEVICE

TECHNICAL FIELD

The present invention relates to a wafer scanning device which causes a wafer or other workpieces to be processed to linearly scan in a vacuum chamber, particularly to a wafer scanning device which moves a semiconductor wafer linearly against an ion beam for ion implantation.

BACKGROUND OF THE INVENTION

In an ion implanter, it is general to cause a wafer to scan (translate) in a reciprocating motion in the particular straight direction so that the every portion of the wafer surface can be uniformly implanted by ions.

One of the conventional, general wafer scanning devices which makes a wafer scan in a reciprocating motion is described as follows referring to FIG. 13. FIG. 13 shows the inner structure of the vacuum chamber where a wafer holder and other components are placed. In the device of FIG. 13, a drive shaft 81a is connected to an arm 81 and another arm 82, which are used to cause a wafer holder 85 to linearly reciprocate.

Following are the details of the device. The first arm 81 is hollow and has both a drive shaft 81a and a driven shaft 81b in it. The shafts 81a and 81b are connected with a belt 81c. The second arm 82 has a bar-shape and is connected to the driven shaft 81b at its base portion. When the drive shaft 81a in the first arm 81 is rotated by means of a drive source such as a motor (not illustrated), the driven shaft 81b rotates while revolving together with the first arm 81 to change the position and angle of the second arm 82. The top portion of the second arm 82 is connected to the slide member 83 which moves along the guide member 84. The slide member 83 is fixed with a wafer holder 85. Accordingly the wafer holder 85 can linearly move by the rotation of the drive shaft 81a.

A similar device is also seen in the disclosure of Japanese publication of unexamined patent application No. H10-326590 (see FIG. 4 in the concerned gazette).

SUMMARY OF THE INVENTION

In the scanning device of FIG. 13, the belt 81c transmits the motive power from the first arm 81 to the second arm 82, so the responsiveness with respect to the transmission is not sufficient. In other words, as the belt 81c expands and contracts easily and the moment of inertia of the arms 81 and 82 with respect to the scan motion is large, the scan speed might affect the accuracy of the control. In addition to it, due to the use of the belt 81c, the rigidity in the scan direction might not be secured and the natural vibration at low frequency tends to generate. Under the influence of that, it might be difficult to keep a uniform scanning speed.

Instead of the device of FIG. 13, another type of wafer scanning device which has no belt is proposed in the above application No. H10-326590. But even the proposed device can not solve all the expected technical problems. There is no description on the proper means to solve the following problems: a problem with the arrangement of a motor or other transmission equipment, which might quite easily generate particles (dust generation) or outgas (molecular contaminants), in a vacuum chamber for processing a semiconductor wafer or the like; and a problem of how to tilt a wafer preferably in order to change the angle of ion implanting.

Moreover, the equipment for transmission or drive being positioned in vacuum also has problems on lubrication, heat radiation (cooling) and the like. When the equipment for transmission or drive is installed in vacuum, conventionally, solid lubrication or special lubrication is necessary for lubrication and a circulation cooling device is needed for heat radiation or cooling. But the costs for the lubricant or equipment and the space for equipment need to be improved and an effort has been made to solve the problems.

The present invention is made to solve the above-mentioned problems and its object is to provide a wafer scanning device which enhances the uniformity of scanning speed by improving the responsiveness with respect to the scanning speed control, optimizes the arrangement of a motor or the like, tilts a wafer in a proper manner, and has no problem of lubrication or heat radiation.

A wafer scanning device of the present invention is a device which causes a wafer (or other workpieces to be processed) to scan in a vacuum chamber including:

a holder which can hold a wafer;

a linear translation structure which causes the holder to scan;

a transmission mechanism and a motor which drive the linear translation structure; and an integrated (or integrally assembled) support frame which supports them (the holder, the linear translation structure and the motor);

wherein the holder and the linear translation structure are installed in a vacuum chamber;

the transmission mechanism includes a first transmission mechanism on a line of travel of the linear translation structure and a second transmission mechanism offset from said line of travel; and the second transmission mechanism offset from the line of travel and the motor are installed in the atmosphere.

In the description above, "a linear translation structure" includes a ball screw, a sliding screw, a planetary roller screw, a rack-and-pinion, etc. and "a line of travel of the linear translation structure" means a linear line along the direction of the linear movement of the structure.

A wafer scanning device of FIG. 5 is one of the embodiments of the present invention. The wall 2 of the vacuum chamber are integrally formed with the support frame 60. The holder 10 and the ball screw 20 are positioned in a vacuum area inside the wall 2; and the motor 50 is positioned in the atmosphere, outside the wall 2.

Thus composed, the wafer scanning device has the following functional features:

Since the linear translation structure like a ball screw, etc., linearly moves the wafer holder, the device shows high responsiveness with respect to the scanning speed control and excellent uniformity of the scanning speed. That is because the linear translation structure, such as a ball screw or the like, has no component to greatly extend and contract, unlike the belt 81c of the conventional device of FIG. 13, and further has high rigidity that prevents the generation of natural vibration at low frequency range.

The motor, being placed not in vacuum but in the atmosphere, will not cause problems with particles or outgas generated from its sliding portion or the like. As a result, it is possible to employ a general type motor (at a low cost). Further, it is not necessary that the lubrication for the sliding portion of the motor or the like be a special type which is expensive.

As the transmission mechanism offset from the line of travel is positioned in the atmosphere as well as the motor, the vacuum chamber includes only the linear translation structure and a few components on the line of travel of the linear translation structure. Thus the device has only few mechanisms or components that require a consideration on generation of the particles and outgas. Therefore the device has the advantage of being composed at low cost and of being easily lubricated.

As both the wafer holder and the linear translation structure to linearly move (scan) the holder are placed in the vacuum area, if the holder and the linear translation structure are positioned in the proper relationship to each other and a proper tilting mechanism is installed to the linear translation structure, it becomes possible to tilt the wafer in a preferable manner. In other words, as shown in FIG. 7(b) for example, when the wafer A is tilted just by inclining the holder 10 while keeping the scan direction s constant, the distance from the wafer A to the ion beam irradiation source differs depending on the portion of the wafer A. On the contrary, as shown in FIG. 7(a), when the wafer A is tilted by inclining the holder 10 together with the scan direction s determined by the linear translation structure (that is, the path of travel of the holder 10), it is possible to remove the unevenness of the distance in the wafer A (and thus to unify the beam density). In order to realize the latter tilting (FIG. 7(a)), it is necessary that both the wafer holder and the linear translation structure which determines the path of scanning, be positioned in the vacuum area as described above.

As the wafer holder, the linear translation structure and the motor are fixed to the integrated support frame, it is easy to tilt the wafer in the preferable manner as mentioned above. In the embodiment of FIG. 5, it might be difficult to tilt the wafer because the wall 2 of the vacuum chamber which is integrated with the support frame 60 can not move. But, as shown in FIG. 6, if the part 2a of the wall 2 is rotatably integrated with the support frame 60, it is easy to preferably tilt the wafer as mentioned above.

The support frame is preferably supported on a side of the vacuum chamber in such a manner that the support frame can rotate about an axis in the vacuum chamber.

The device of FIG. 2 or 6, for example, is one of the embodiments of such a device.

In this device, the support frame, which holds the wafer holder, the linear translation structure and the motor, can rotate about an axis. Therefore it is possible to tilt the wafer in a preferable manner as shown in FIG. 7(a) for example.

The present invention can further has the following features:

the support frame is positioned in the vacuum chamber together with the holder, the linear translation structure, the transmission mechanism, and the motor;

the support frame has a vacuum-tight cover which is open to the outside of the vacuum chamber (that is, to the atmosphere) via a ventilation pipe and provided with a seal member along the line of travel of the linear translation structure in order to isolate the interior of the vacuum chamber from the atmosphere; and (all of) the second transmission mechanism offset from the line of travel of the linear translation structure and the motor are placed in the vacuum-tight cover which is open to the atmosphere.

FIGS. 1–4 show one of the embodiments of the device, too.

Referring to FIG. 2, the support frame 60 is positioned inside the wall 2 of the vacuum chamber. The vacuum-tight cover 70 (the hatched part of FIG. 2) is open to the outside of the vacuum chamber via the ventilation pipe 71 and provided with the seal member 72 positioned between the motor 50 and the ball screw 20, in which the motor 50 is placed.

Accordingly the whole of the scan driving group including a motor is positioned in the vacuum chamber, and that brings the advantages on composition and positioning of the scan driving group. That means that the scan driving group can be compactly composed and easily be attached to the device.

In addition to it, by the use of the above-mentioned vacuum-tight cover, it is possible to use the motor under atmospheric pressure though the motor is installed in the vacuum chamber. That is because the vacuum-tight cover is airproof, provided with the above mentioned seal member insulating the vacuum area from the atmosphere, and open to the atmosphere via a ventilation pipe. When a motor is used under the atmospheric pressure, the problem of generation of the particles and outgas is removed. That makes it possible to employ a motor of general specifications.

The support frame is preferably supported by a wall of the vacuum chamber via a hollow rotation shaft including the ventilation pipe in it (in such a manner that the support frame can rotate), and changes its angle (for tilting) by the rotation of the hollow rotation shaft.

When the support frame is positioned in the vacuum chamber together with the holder, the linear translation structure and the motor, and further the vacuum-tight cover with the ventilation pipe is employed so that the motor can placed in the atmosphere, it might be taken into consideration that the support frame is installed rotatably and the ventilation pipe is composed by a flexible hose extended to the outside of the vacuum chamber from the interior of the vacuum-tight cover. However, a longer hose might be required and the various restrictions might be caused like that, for example, the hose be arranged not to prevent the support frame from changing its angle freely. That might make the device disadvantageously complex and large. On the other hand, if the support frame is installed via the hollow rotation shaft including the ventilation pipe in it as described in the former paragraph, the ventilation pipe can be included in the rotation shaft compactly and the support frame can smoothly change its angle. Accordingly the support frame can freely change its angle by rotating the rotation shaft, while the ventilation pipe stays in the rotation shaft and keep its shape without hanging or bending.

The transmission mechanism preferably includes a transmission belt which connects the first transmission mechanism on the line of travel of the linear translation structure and the second transmission mechanism offset from the line of travel, and the transmission belt is installed in the vacuum-tight cover (that is, in the atmosphere).

In such a device, the transmission belt, which easily generates particles or outgas as well as the motor, is positioned in the vacuum-tight cover. That prevents generation of particles or the like in the vacuum chamber and thus secures the preferable vacuum environment where a wafer is caused to scan.

The wafer scanning device still further has the following features:

a surface of the wafer held by the holder is parallel to the path of travel of the holder determined by the linear translation structure (for example, the direction of an axis of a ball screw);

the support frame is arranged in such a manner that it can change its angle (namely the frame can incline or rotate) and can cause the holder to tilt (in a manner shown in FIG. 7(a), for example) with keeping that condition (that is, the surface of a wafer is parallel to the path of travel of the holder); and the center line for changing the angle of the support frame is in (or very closely to) a plane including the surface of the wafer held by the holder.

Thus composed, the wafer scanning device is properly incline the linear translation structure while keeping the holder in an appropriate position to the linear translation structure, so the wafer is tilted in a preferable manner as earlier mentioned. In other words, during the scan, the distance from an irradiation source of an ion beam or the like to a wafer is always kept constant at every portion of the wafer, as a result, the unification of the beam density is achieved.

Moreover, in such a device, the center line of the angle change of the support frame is in the plane including the surface of the wafer, therefore, when the holder and wafer tilt by changing the angle of the support frame, the distance from the beam irradiation source to the surface of the wafer is invariable. If, as shown in FIG. 7(c) for example, the center line of the change of angle (that is the center of tilting) Ot of the support frame is offset from the surface of the wafer, the position of the wafer to the direction of the beam irradiation changes due to tilting. On the contrary, as shown in FIG. 7(a), if the center line of the change of angle Ot is in the surface of the wafer, such a change never occur. Keeping the distance from the irradiation source of a beam or the like to the surface of the wafer constant brings the advantage of unifying the ion implantation density easily.

The support frame is preferably provided with a belt and a pulley to transmit the drive power of the motor to the linear translation structure, and further provided with a linear guide member (including a linear track and a sliding component which can smoothly move along the track) to guide the movement of the holder.

The use of the linear guide member makes the linear motion of the holder, which causes a wafer to scan, especially smooth. In addition, an output shaft of the motor is connected to the linear translation structure like a ball screw not directly but via the belt and the pulley, so it is possible to freely set the motor in the proper position to the linear translation structure. Accordingly, it is possible to compose the wafer scanning device which is compact in size and functions very smoothly, while meeting the restrictions of placing the motor in the atmosphere, for instance. In addition to it, the moment of inertia about the rotation of the linear translation structure (such as a ball screw) is very small compared to that of the arm of the embodiment of FIG. 13, so the possibility of expansion of the belt is too small to prevent the control of the scanning speed. However; it is desirable to enhance the rigidity of the transmission belt by shortening the belt for example.

The seal to isolate the interior of the vacuum area from the atmosphere can be a magnetic fluid seal which is installed on a rotation shaft directly connected to the linear translation structure.

What the rotation shaft directly connected to the linear translation structure means is a shaft connected to the portion near the end the bolt of the ball screw (that is, a cylindrical portion without a thread) or a shaft positioned close to the bolt and concentrically connected to it, for example.

In this case, being provided with a magnetic fluid seal as a seal member to isolate the vacuum area from the atmosphere, the device generates fewer particles compared to the case using other sealing means. That reduces the inconvenience in the process or the work in vacuum, such as the ion implantation. Moreover, installation of such a seal member to the point quite close to the linear translation structure reduces mechanisms or components positioned in the vacuum area. A mechanism placed in vacuum has to be composed to generate fewer particles or outgas and generally requires a special lubrication being provided to its sliding portion or a sealed composition, which is special and expensive. Accordingly the use of fewer mechanisms in vacuum means that it is possible to compose a wafer scanning device of easy to use at a lower cost. In addition to it, the magnetic fluid seal, being provided to the rotation shaft, is hardly out of lubricant and has stable sealing function.

The linear translation structure and other components, having a rolling surface or a sliding surface and installed in a vacuum chamber, are preferably assembled so that it is possible to exchange them as a unit.

Regarding the device provided with a linear guide member, as mentioned above, it is preferable to assemble the linear guide member (including a rolling surface or a sliding surface as well) into the unit, too.

In a mechanism or component like a ball screw which has a rolling surface or a sliding surface and is placed in a vacuum area, general lubrication means can not be applied to, because the rolling surface or the sliding surface has the problem of generating dusts or the like. As a result, the linear translation structure, etc., requires a special lubrication and special maintenance for it.

In the wafer scanning device of the present invention, the components which need special treatment in vacuum are assembled in such a manner that they can be exchanged as a unit, so the maintenance for lubrication or the like is quit easily performed as follows: remove the unit from the wafer scanning device, then install the unit which has already received maintenance (or a new unit). Thus the function of the device including the scan driving group is kept smoothly. It is convenient for the next maintenance work if the component of the unit removed from the device, a screw ball for example, is exchanged with a new one or reprocessed one.

It is also preferable in the device that the wafer fixed to the holder is caused to scan by means of the linear translation structure while an ion beam is irradiated to the wafer.

In such a device, the ion beam irradiation to a semiconductor wafer is performed in a desirable manner and ion implantation to the wafer is properly executed.

The wafer scanning device preferably has a first transmission coupling connected between the transmission mechanism and the motor to drive the linear translation structure.

By the use of a transmission coupling as mentioned above the arrangement of the transmission mechanism and the motor is considerably free and it is easy to assemble and disassemble. In other words, unlike the case that the transmission mechanism and the motor are directly connected to each other, it is easy to freely determine the relative position between the shafts, for example, and smoothly assemble even if there are a few error margins between the shafts (disagreement between each center of the shafts).

The linear translation structure, which causes the holder to scan, can be a ball screw positioned in the vacuum chamber.

In general, the linear translation structure may be a sliding screw, a planetary roller screw or a rack-and-pinion, etc. as mentioned above. But, a ball screw has the advantages of moving smoothly and generating a fewer mechanical loss. It is also advantageous in respect of cost that a general-purpose ball screw is acceptable. Further a ball screw makes a better responsiveness to the speed control. Accordingly, with the ball screw installed as the linear translation structure, the device can execute the smooth scanning motion of the holder efficiently and accurately.

A rolling surface (which moves as rolling) and a sliding surface (which moves as sliding) of the ball screw are preferably coated with a diamond-like carbon film (DLC film) and further covered by a baking film of fluorine oil (DFO coating).

As for the device including the above-mentioned linear guide member, it is also preferable that is coated with a diamond-like carbon film and a baking film of fluorine oil (at its rolling surface and sliding surface).

In such a device, as a ball screw placed in a vacuum area is coated with a diamond-like carbon film and a baking film of fluorine oil, quite few particles or outgas are generated and lubrication is kept stable for a long time. The diamond-like carbon film (DLC film) is a film of high-hardness carbon like a diamond, which is made by an ion plating method, etc. and has a lubricate plane due to its amorphous composition with a diamond bonding or graphite boding, so it has excellent property of low friction and of low abrasion. The baking film of fluorine oil (DFO coating) is a viscous and lubricant film which is made by baking fluorine oil, generates few dusts and has a medium property between dry and wet and also has high-durability.

The ball screw can be a ball-retainer-embedded ball screw.

Some ball screws have spacer balls of a smaller diameter as means to prevent collision between adjacent ball, however, the number of loaded ball is decreased and that might lower the durability. At that point, a ball-retainer-embedded ball screw can prevent collision between adjacent balls and increase the number of loaded ball, so it has the advantage in durability. When the ball screw has a good durability, the abrasion goes slow and the generation of particles or outgas decreases for a long time, and that is particularly desirable for driving a wafer to scan in vacuum.

The ball screw is preferably connected to the transmission mechanism via a second transmission coupling.

With using the second transmission coupling, the arrangement of the ball screw or the transmission mechanism becomes considerably free and assembling or decomposing becomes easy. In other words, unlike the case that the ball screw and the transmission mechanism are directly connected each other, the relative position between the shafts is easily and freely determined and it is also easy to smoothly assemble even if there is some error margin between the shafts (disagreement between each center of the shafts).

The ball screw is preferably supported by the support frame via a radial bearing at its either end and further supported by the support frame via a pre-loaded thrust bearing (a pre-loaded bearing combining angular ball bearings, or other precision bearings) at its end closer to the transmission mechanism.

The thrust bearing has a function to remove the play in the axial direction of the ball screw and that helps the wafer to accurately perform scanning motion. As the thrust bearing is placed near the end of the ball screw at closer side to the transmission mechanism, if the ball screw is lengthened by heat or the like, there is no problem on the connection with the transmission mechanism.

The wafer scanning device preferably includes a fluid (such as cooling water) passage which cools the ball screw and is formed to run near the thrust bearing of the support frame.

Since the fluid cools the ball screw and runs near the thrust bearing, the thrust bearing is cooled, too. Although, during scanning motion of the wafer, heat generates in the ball screw and the thrust bearing due to the rolling of the ball, the cooling passage formed in such a manner can remove the inconvenient of heating, despite in a vacuum area where heat is isolated. In other words, the proper cooling by fluid improves the life of each component and reduces the generation of particles and outgas.

The wafer scanning device according to the present invention has the following effects:

the wafer holder, with linearly moved by means of the linear translation structure like a ball screw etc., shows better responsiveness with respect to the scanning speed control and can scan at a constant speed;

as the motor is placed in the atmosphere and there are only few mechanisms or components exposed in the vacuum chamber, the device is more easily lubricated at low cost;

as both the wafer holder and the linear translation structure are placed in the vacuum area, it is possible to tilt the wafer in a preferable manner;

as the whole scan driving group including a motor is positioned in the vacuum chamber, the scan driving group can be composed compact in size and provided to the device easily, additionally, the merit due to positioning the motor in the atmosphere remains;

as the device is provided with the support frame installed via the hollow rotation shaft including the ventilation pipe in it, the ventilation pipe can be included in the rotation shaft compactly and the support frame can always change its angle smoothly;

as the transmission belt is positioned in the vacuum-tight cover, the preferable vacuum environment is secured;

the wafer is tilted, during the scan, in such a preferable manner that the distance from an irradiation source of an ion beam or the like to the wafer is always constant at every portion of the wafer, and thus the beam density to the wafer can be unified, and additionally the distance from an beam irradiation source to the surface of the wafer is not affected by tilting;

the use of the linear guide member makes the linear motion of the holder considerably smooth and the use of the belt and the pulley makes it possible to freely set the motor in the proper position with respect to the linear translation structure;

due to the function of a magnetic fluid seal, the generation of particles is restricted and thus the process or work in a vacuum area such as an ion implantation is performed advantageously, and moreover, as there are fewer mechanisms or components in the vacuum area, it is possible to compose a device of easy to handle at a low cost;

as the components which needs special treatment in the vacuum are assembled in such a manner that they can be exchanged as a unit, maintenance work for keeping the function of lubrication is quit easily performed;

ion beam irradiation and implantation to a semiconductor wafer is performed in a proper manner;

as a transmission coupling is used, it is considerably free to arrange the transmission mechanism and the motor and it is easy to assemble and disassemble the device;

as a ball screw is employed as the linear translation structure, the smooth and accurate scanning motion of the holder can be achieved efficiently;

the use of a ball screw which is coated with a diamond-like carbon film and a baking film of fluorine oil restricts the generation of particles or outgas and keeps lubrication stable for a long time;

the use of a ball-retainer-embedded ball screw enhances durability of the ball screw and produces a desirable vacuum environment where few particles or outgas are generated;

the use of a transmission coupling makes the arrangement of the ball screw or the transmission mechanism almost free and makes it easy to assemble or disassemble the device;

the use of a thrust bearing removes the play of the ball screw and achieves the accurate scanning motion of the wafer; and as the ball screw or the thrust bearing is cooled by fluid, the life of each component is postponed and the generation of particles or outgas is restricted, and that keeps the vacuum environment desirable.

BRIEF DESCRIPTION OF DRAWINGS

FIG. 5(a) is a front view of the scan driving group 4 of another embodiment according to the present invention;

FIG. 5(b) is a side view of the scan driving group 4;

FIG. 5(c) is another side view of the scan driving group 4;

FIG. 8 is a longitudinal sectional view totally showing the implanting portion of the ion implanter;

FIG. 9(a) is a side view showing another embodiment of the wafer scanning device;

FIG. 9(b) is a rear view of the wafer scanning device shown in FIG. 9(a) taken along line b—b in the arrow direction;

DETAILED DESCRIPTION OF THE INVENTION

Referring to FIGS. 1–4 and FIG. 8, the first embodiment of the invention is hereafter described.

Figure 1A:
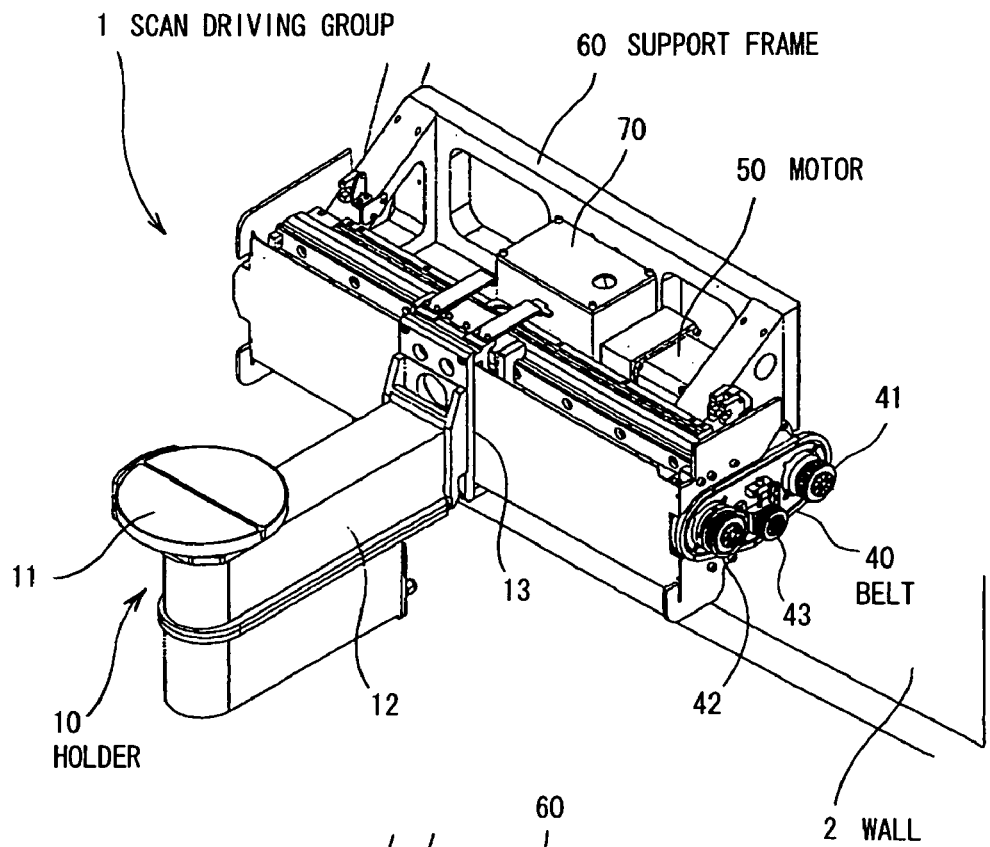
FIG. 1(a) is a perspective view illustrating a scan driving group 1 in the first embodiment of the ion implanter according to the present invention.
Figure 4:
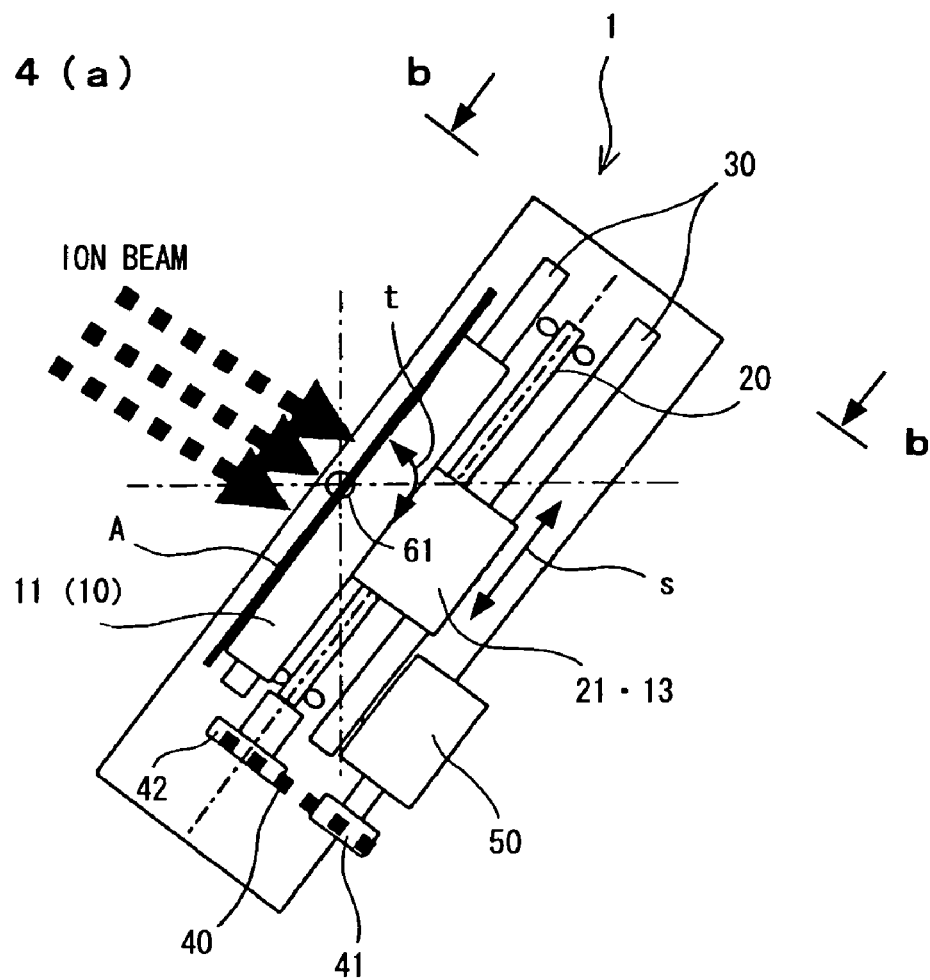
FIG. 4(a) is a schematic view typically showing the composition and the motion of the scan driving group 1.
FIG. 4(b) is a side view of the scan driving group 1 shown in FIG. 4(a) taken along line b—b in the arrow direction.
Figure 4:
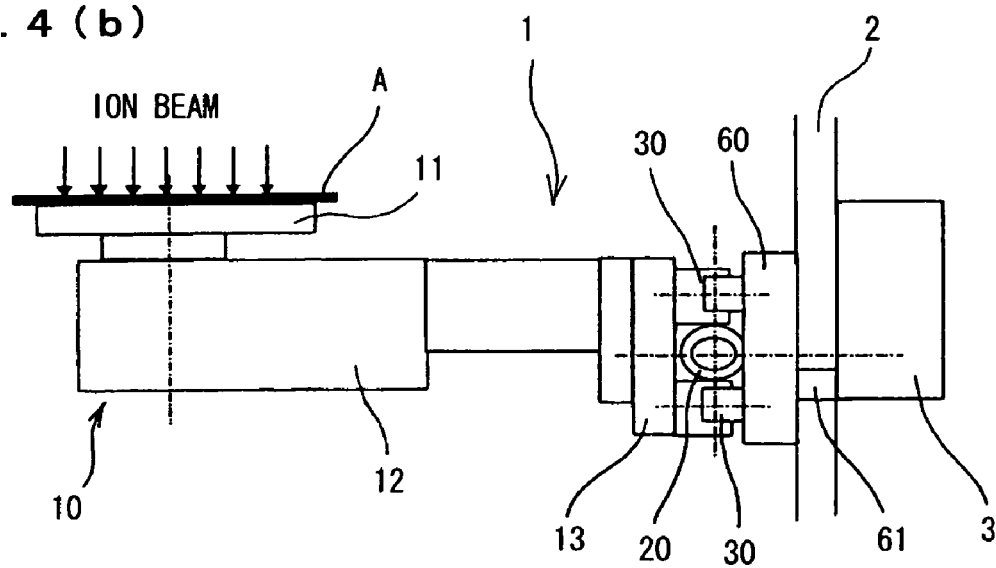

The scan driving group 1 is, as shown in FIG. 8 and FIG. 1(a), positioned inside the wall 2 forming a vacuum chamber of the ion implanter and composes a wafer scanning device together with a tilt driving group (reference letter 3 of FIG. 4(b); includes a motor and other drive source and a transmission mechanism for the motive power). A wafer (reference letter A of FIG. 4) is held by a chuck plate 11 of a holder 10 which is moved by means of a ball screw 20 (see FIG. 1(b) or FIG. 2, etc.) and thus causes the wafer to scan against an ion beam (see FIG. 4). In general, while an ion beam scans with high frequency in a fixed direction (direction x), the wafer is moved to scan in the direction perpendicular to the beam (direction y; the longitudinal direction of the ball screw 20). The use of the ball screw 20 makes the wafer light in the scanning motion so the scanning motion is good in responsiveness and even in speed.

The detailed description of the scan driving group 1 is as follows. As shown in FIG. 1, it includes the following chief functioning parts: the holder 10 of a wafer; the ball screw 20 that moves it to the scan direction (the above-mentioned direction y); a motor 50 that rotates the ball screw 20; and a support frame 60. The support frame 60 holds the holder 10, the motor 50 and other composition equipment of the scan driving group 1 together. The support frame 60 is rotatably supported by the wall 2 and can tilt by the force of rotation drive generated from the tilt driving group (reference letter 3 of FIG. 4(b)). A support member 60', which is part of the support frame 60, supports the axis connection of the motor 50.

Figure 2:
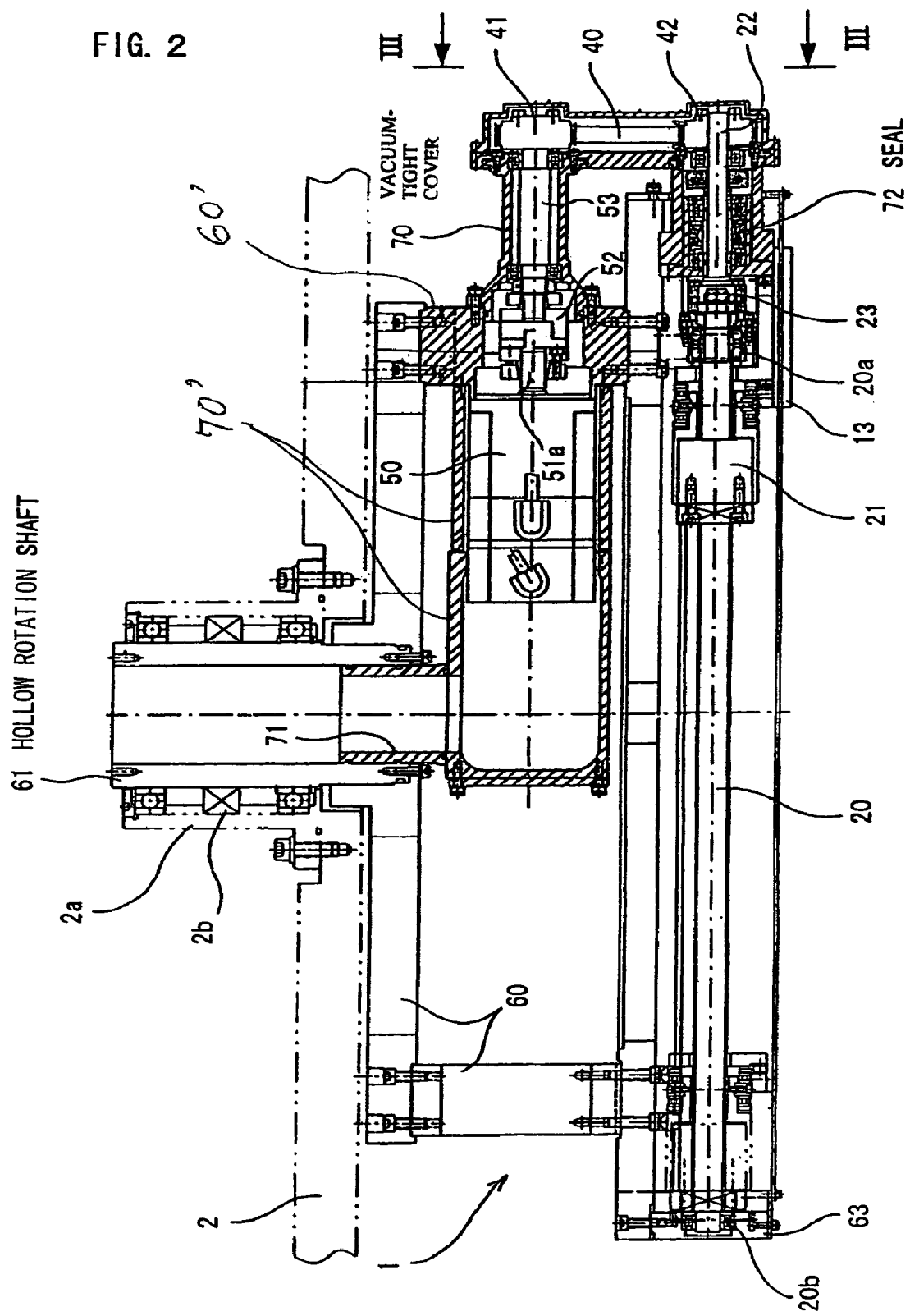
FIG. 2 is a sectional view showing the essential part of the driving mechanism of the scan driving group 1 of FIG. 1.

The ball screw 20 is, as shown in FIG. 2, supported by the support frame 60 via radial bearings 20a, 20b at its both sides. Also the ball screw 20 is supported by the support frame via a precision thrust bearing 20c at about its end closer to a belt 40 or other transmission mechanisms (the upstream of power transmission). The precision thrust bearing 20c, which is for example a pre-loaded bearing composed of angular ball bearings, prevents the ball screw 20 from playing in the axial direction.

Figure 1B:
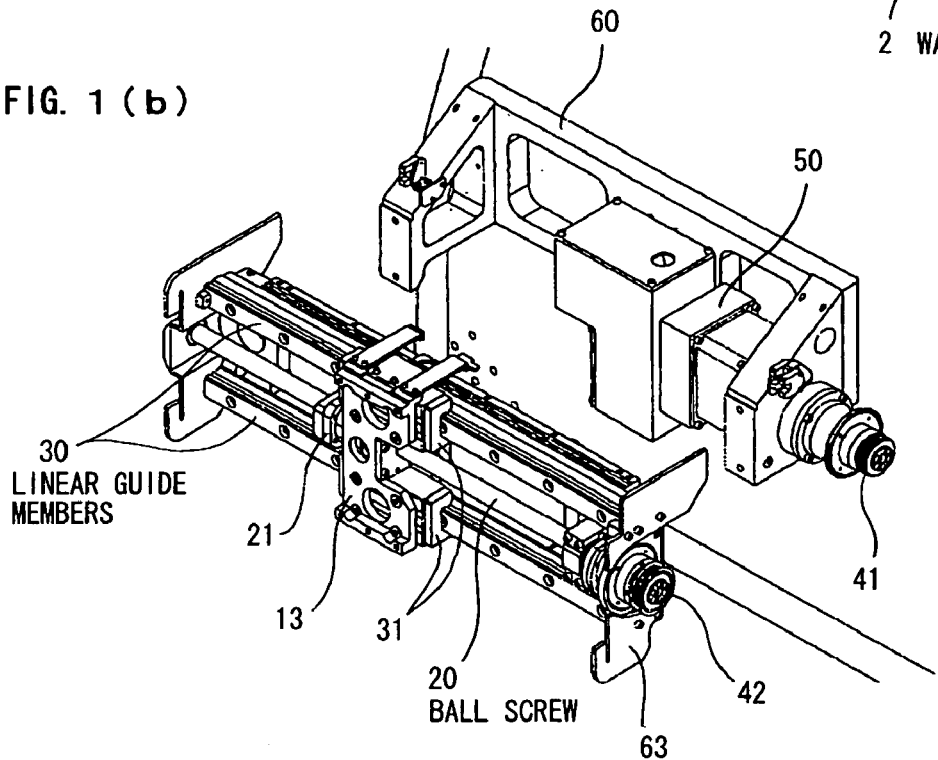
FIG. 1(b) is an exploded perspective view of the scan driving group 1.
Figure 3:
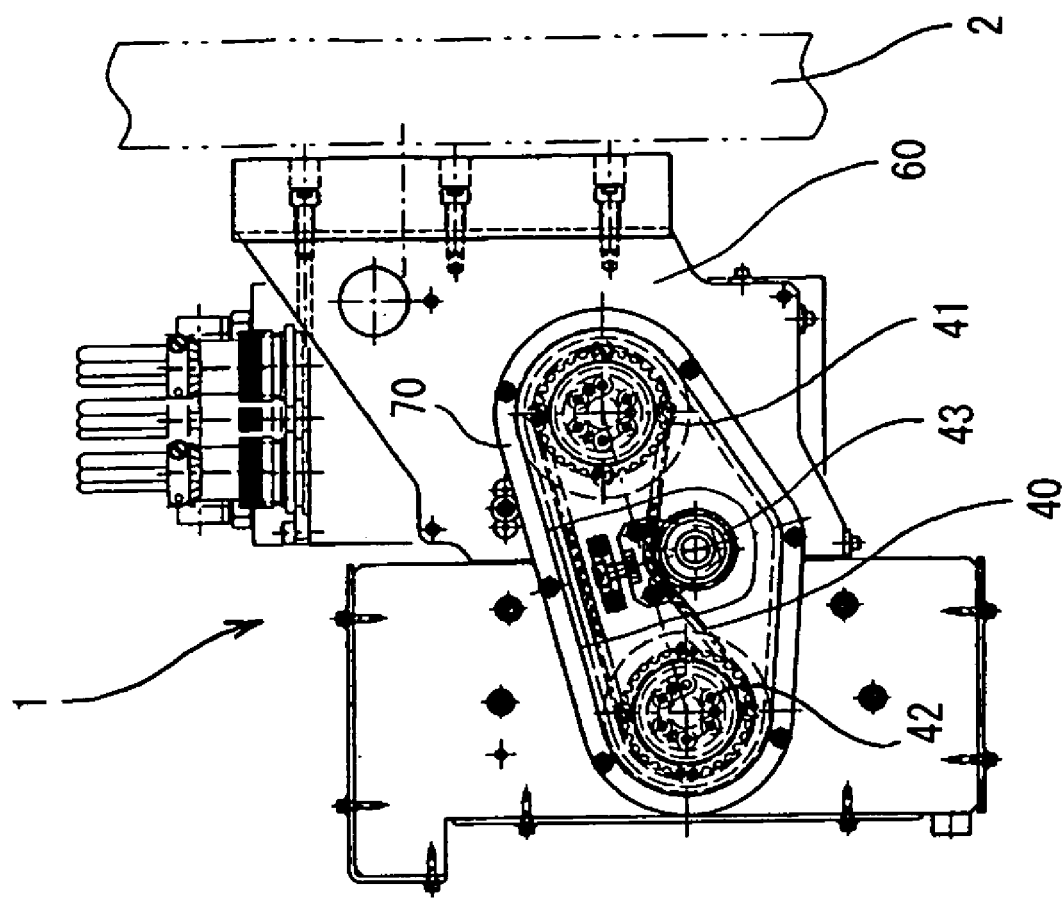
FIG. 3 is a side view of the driving mechanism shown in FIG. 2 taken along line III—III.

The holder 10 includes the chuck plate 11, a chuck body 12 and a slide plate 13, as shown in FIG. 1(a). The slide plate 13 is connected to a nut 21 of the ball screw 20. Referring to FIG. 1(b), linear guide members 30 are disposed in parallel to both sides of the ball screw 20 and provided with a slide member 31, which can move along the track of the members 30 and is connected to the slide plate 13 of the holder 10. The chuck plate 11 is positioned in such a manner that the surface of a wafer fixed to the plate 11 is parallel to the longitudinal direction of the ball screw 20. The motor 50 is placed in a manner that the output axis (reference letters 51a of FIG. 2) is in parallel to and just far from the bolt of the ball screw 20. The power from the motor 50 to the ball screw 20 is transmitted by transmission mechanisms such as a transmission rubber belt 40 (a timing belt with gear teeth), a driving pulley 41, a driven pulley 42 and a tension pulley 43, etc., as shown in FIG. 1(a) and FIG. 3. Some transmission mechanisms are on the line of travel of the ball screw 20 and the other are offset from the line.

Being used in vacuum, the ball screw 20, the linear guide member 30 and other components are made to the special specifications for removing the problem of dusts or outgas generated from the portions where two elements contact and relatively move: they are coated with a diamond-like carbon film (DLC film) and a baking film of fluorine oil (DFO film) which are special means to enhance the lubrication performance and abrasion resistance. What the portions where two elements contact and relatively move means the surfaces of a thread of the ball screw 20 or the nut 21, steel balls of the ball screw 20, grooves or steel balls of the bearings 20a, 20b and 20c supporting the ball screw 20, the track of the linear guide member 30, and steel balls of the slide member 31, etc., where each element rolls and slides. In order to easily maintain and check such components made to special specifications and to easily enhance the lubrication performance and abrasion resistance again in case that the coatings are abraded and damaged, the ball screw 20 and the linear guide member 30, etc., (including the slide plate 13 and the pulley 42, etc.) are composed so as to be integrally removed from the scan driving group 1, as shown in FIG. 1(*b*). In other words, the components such as the ball screw 20 are assembled in a compact frame 63 which is removably connected to the support frame 60.

The support frame 60 and equipment or components held by the support frame 60, such as the holder 10, the ball screw 20 and the motor 50, are arranged inside the wall 2 of the vacuum chamber as described above. But the illustrated scan driving group 1 is composed in such a manner that a lot of things including the motor 50 can be used in the atmosphere. That is because when the equipment or components are used in the atmosphere, the particles or outgas generated by them will not cause any problem. That also means it is possible to employ inexpensive equipment or components of a general specification.

In order to use the motor 50 and the like in the atmosphere, they are composed as follows. Referring to FIG. 2 (and FIG. 3), the motor 50, the belt 40, the pulleys 41, 42, 43, short shafts 53, 22, and the like, are covered with a vacuum-tight cover 70 (the hatched part in FIG. 2), which is open to the atmosphere, the outside of the wall 2. The vacuum-tight cover 70 is a hollow body, which is composed of a plurality of boxy or cylindrical hollow components tightly connected by a packing or the like. the motor 50 is covered with a vacuum-tight cover 70' having a ventilation pipe 71 which is fixed to the portion near the motor 50 and leads to the atmosphere. In the sealed space thus formed in the vacuum-tight cover 70, the followings are included as shown in FIG. 2: the motor 50; a coupling 52 connected to the output axis 51*a* of the motor 50; the short shaft 53 connected to the coupling 52; the belt 40 (these are hereafter called the transmission mechanism offset from the line of travel of the ball screw 20); the pulleys 41, 42, 43; the short shaft 22 fixed with the pulley 42; and bearings attached to them. A magnetic fluid seal 72 is provided between the vacuum-tight cover 70 and the peripheral surface of the short shaft 22.

In order to rotatably support the whole of the scan driving group 1, the support frame 60 is integrated with a hollow rotation shaft 61 which is inserted in and supported by a support hole 2*a* of the wall 2. A seal member 2*b* (such as a magnetic fluid seal) is provided to the inserted portion of the shaft 61. By inserting the ventilation pipe 71 of the vacuum-tight cover 70 in the hollow rotation shaft 61 (and attached with a seal member at the inserted portion), the pipe 71 can lead to the atmosphere. Air can flow in and out between the interior of the vacuum-tight cover 70 and the outside of the wall 2 via the inside of the ventilation pipe71, where a power supply line, a control line, a signal line or the like can run, too. The above-mentioned tilt driving group (reference letter 3 of FIG. 4 transmits the rotation power to the hollow rotation shaft 61 and thus causes the whole of the scan driving group 1 to tilt together with the support frame 60.

Since the seal 72 is provided between the vacuum-tight cover 70 and the short shaft 22, the things placed over it such as the coupling 23, the ball screw 20, the bearings 20*a*, 20*b*, 20*c*, the nut 21 and the linear guide member 30, etc., are exposed to the interior of the vacuum chamber. Out of consideration for it, the rolling surface or the sliding surface of the ball screw 20 and the linear guide member 30 is coated with a DLC film or a DFO film as mentioned above. In addition to it, a ball-retainer-embedded ball screw is adopted as the ball screw 20, which has a long life even in vacuum, special environment.

The composition of the essential moving part of the scan driving group 1 is typically shown in FIGS. 4(*a*) and (*b*), which functions as the following a) and b), serving as a wafer scanning device in an ion implanter.

a) When a wafer A is attached to the chuck plate 11 of the holder 10, the rotation of the ball screw 20 by the motor 50 causes the wafer A to move (scan) along the ball screw 20 (the longitudinal direction of its bolt) with the holder 10. As described above, an ion beam repeatedly scans in the direction x (perpendicular to the sheet surface of FIG. 4(*a*); the right and left directions of FIG. 4(*b*)) at the specific position and the ball screw 20 is positioned in the direction y, which is perpendicular to the moving direction of the irradiation point that is the intersection of the beam and the wafer A. The direction y is defined as a scan direction s of the wafer A. During the scan, the wafer A on the chuck plate 11 is fixed so that its surface is perpendicular to the direction of the ion beam seen along the center of the axis of the ball screw 20, as shown in FIG. 4(*b*).

b) It is possible to change the angle of ion implantation against the surface of the wafer A (tilt angle) by inclining the whole of the scan driving group 1 via the support frame 60. As described above, the support frame 60 is supported by the wall 2 of the ion implanter via the hollow rotation shaft 61. Therefore when the shaft 61 rotates by means of the tilt driving group 3 positioned outside the wall 2, the support frame 60 changes its angular position about the axis of the shaft 61 according to the tilt direction t shown in FIG. 4(*a*). As the support frame 60 holds the whole of the scan driving group 1 including the ball screw 20, when the support frame 60 thus changes its angle, the holder 10 tilt with the ball screw 20, and that can change the angle of the wafer A and the scan direction s to the same degree. That is, the surface of the wafer A and the longitudinal direction of the ball screw 20 determining the scan direction s of the wafer A tilt to the direction t, while the both keep parallel to each other. In addition, the hollow rotation shaft 61 is properly positioned so that the center of the tilt is in the surface of the wafer A on the holder 10, therefore the surface of the wafer A does not only come close to nor only go far from the ion irradiation source with tilting. That means that the distance from the ion beam irradiation source to every spot of the wafer A is independently constant whatever the tilt angle of the wafer A is.

FIGS. 5(*a*), 5(*b*) and 5(*c*) show the second embodiment of the present invention (third-angle drawings). The element used in common to the first embodiment of FIGS. 1–4 is put with the same reference letter and the detailed description of it is omitted.

In a scan driving group 4, exemplary illustrated in FIG. 5, the support frame 60 which supports the ball screw 20 for moving the wafer A (the holder 10) is integrally attached to the wall 2 of the ion implanter, and the motor 50 which drives the ball screw 20 is positioned outside the wall 2, namely in the atmosphere. The motive power from the motor 50 is transmitted to the ball screw 20 via a rubber belt 40 and pulleys 41, 42 which are covered with a seal type cover 75 in the vacuum chamber. In addition, a seal member 76 is provided to the inside of the extended cover 75 near the end of the bolt of the ball screw 20 to which the driven pulley 42 is attached. Thus the cover 75 and the seal member 76 insulate the atmosphere, which reaches to the outside of the wall 2, from the vacuum area inside the wall 2. The seal member 76 can start to use a magnetic fluid seal in order to prevent dusts or the like from generating in the vacuum area.

Also in the scan driving group 4 of FIG. 5, the wafer A scans with high responsiveness at highly stable speed based on the rigidity of the ball screw 20. In addition to it, because the motor 50, the belt 40, and the pulleys 41, 42 are positioned in the atmosphere, the dust generated by their moving portions causes no travel. Therefore, general type motors, belts and pulleys are advantageously available for them.

Figure 6:
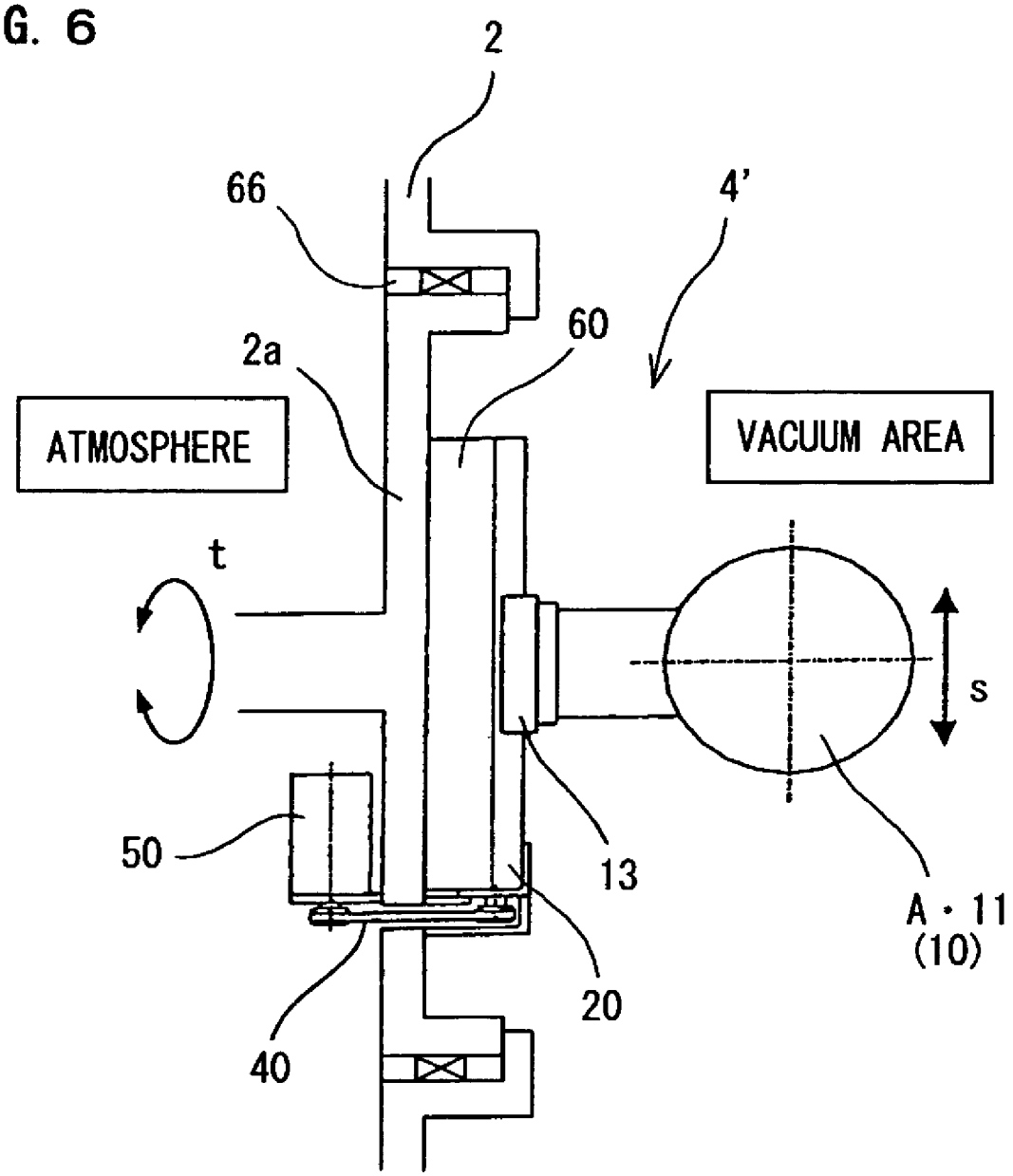
FIG. 6 is a plan view of the scan driving group 4' which is an alternation of the scan driving group 4.

FIG. 6 is a top view of another embodiment (a scan drive group 4') which is an alternation of the scan drive group 4 of FIG. 5. In the embodiment of FIG. 5, the support frame 60 is integrally formed with the wall 2 of the vacuum chamber and difficult to rotate, therefore it is difficult to tilt the wafer A. But by partially alternating the composition as follows, it becomes possible to properly tilt the wafer A: for example in the scan driving group 4' of FIG. 6, a part 2a of the wall 2, which is integrated with the support frame 60 (or the support frame 60 itself), is assembled to the other part of the wall 2 in such a manner that the part 2a can freely rotate. A circular support member 66 including a bearing and a seal (such as a magnetic fluid seal) is provided between the wall 2 and the part 2a of the wall 2.

Figure 7:
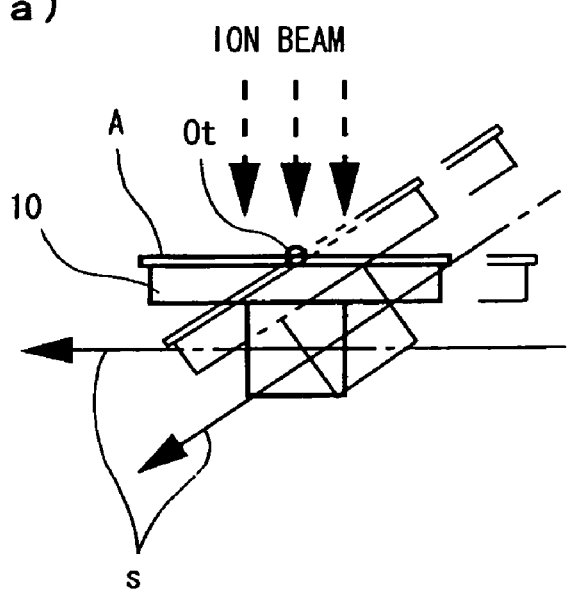
FIGS. 7(a)–7(c) are schematic views for explanation of the relation between the scan direction s of the wafer A, the tilt direction of the wafer A and the direction of an ion beam.
Figure 7:
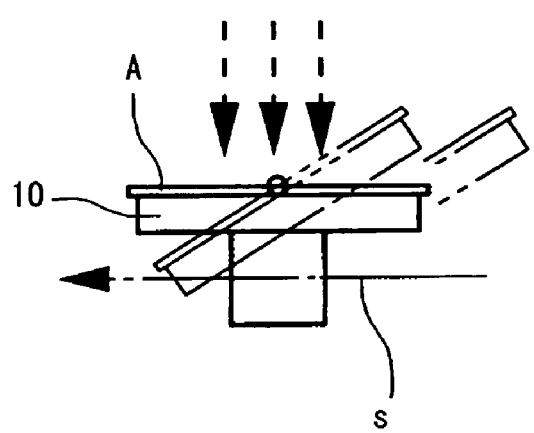
Figure 7:
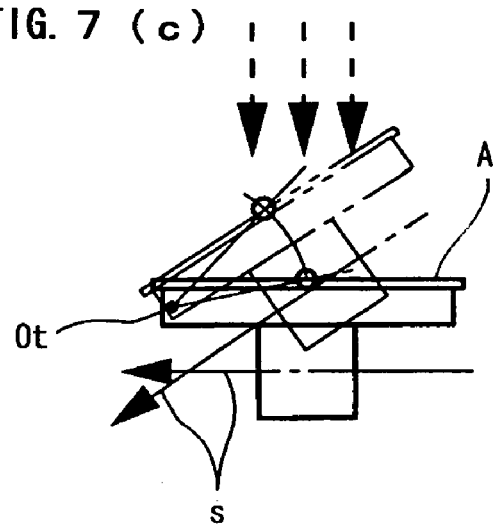

Also in the scan driving group 4' of FIG. 6, there are merits with respect to the scan speed, responsiveness and the type of the motor 50, etc. Further, there is a merit due to the above-mentioned tilting: as the ball screw 20 determining the scan direction is caused to tilt together with the wafer A (the holder 10), the preferable tilt is achieved in a manner shown in FIG. 7.

FIGS. 9(a) and 9(b) shows another embodiment of the wafer scanning device. The element put with the same reference letter as that in FIGS. 1–8 has the same function. As shown in FIGS. 9(a) and 9(b), the angle of the support frame 60 may be set (changed or fixed) by means of manual control using stopper or the like, not by means of a motor or the like.

Figure 10:
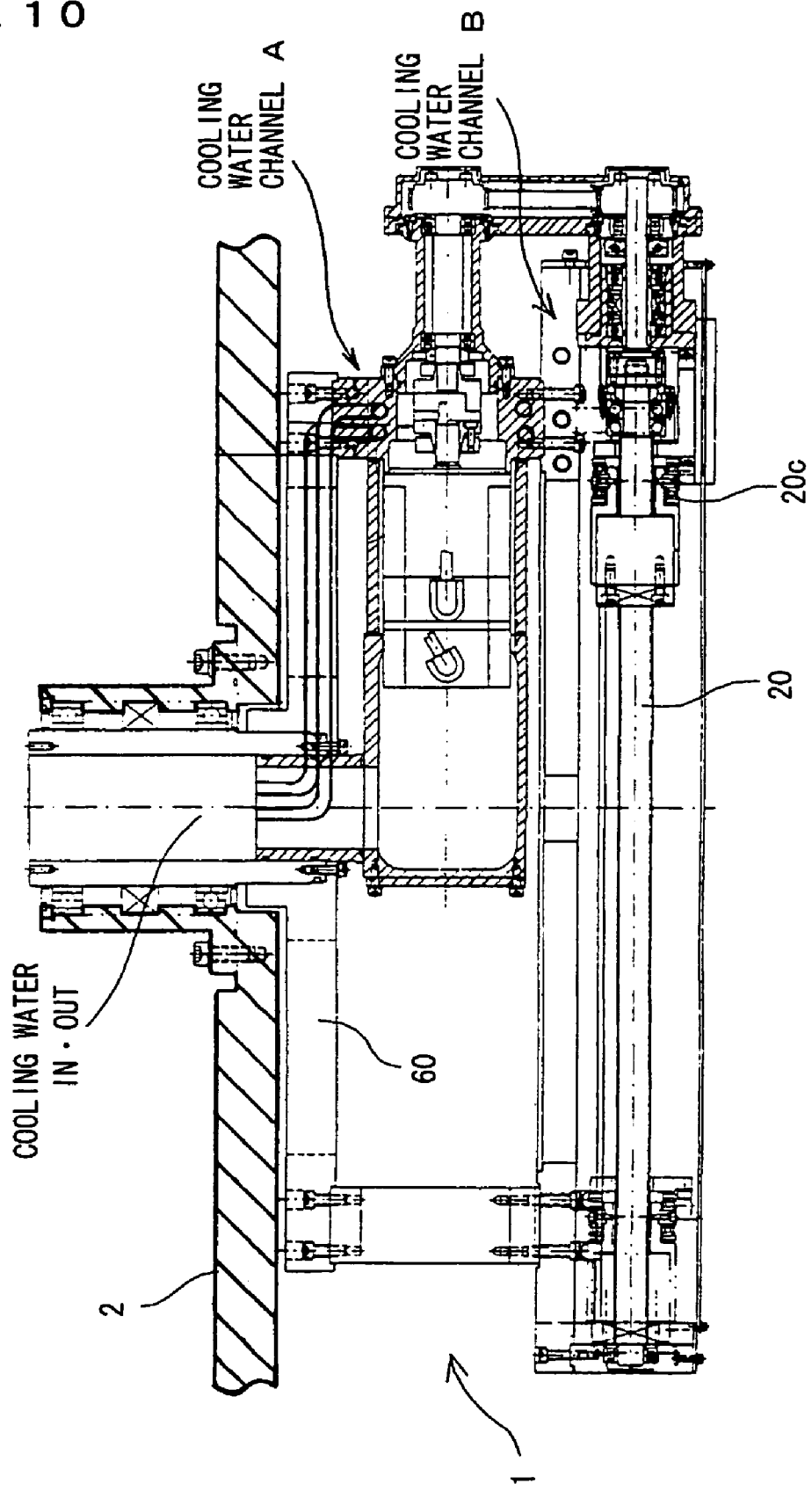
FIG. 10 is a sectional view of an alternation of the scan driving group 1 of the wafer scanning device.

FIG. 10 is a sectional view showing another embodiment of the scan driving group 1 of the wafer scanning device. The ball screw 20, the bearing 20c or the like, which are placed in the vacuum chamber and hopelessly cooled by heat transfer via air, are cooled by the cooling water which runs through the cooling passage A and cooling passage B provided to the support frame 60 or the like, as illustrated in FIG. 10. When the load of the ball screw 20 or its bearing is large, it is preferable to cool them in such a manner. In FIG. 2 and FIG. 10, the element which is common to each other or has the same function with each other is put with the same reference letter (same in the following drawings).

Figure 11:
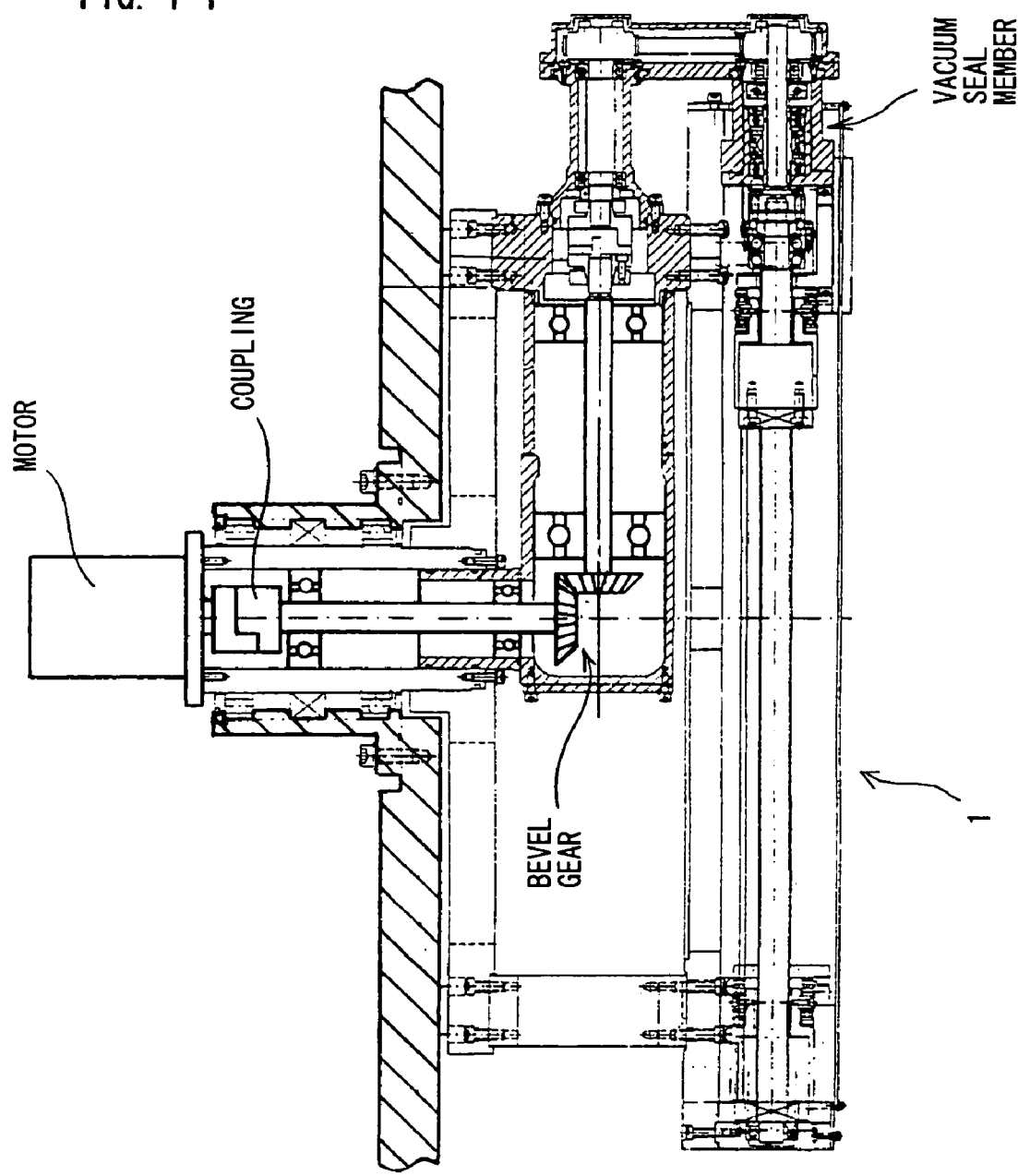
FIG. 11 is a sectional view of another alternation of the scan driving group 1 of the wafer scanning device.

FIG. 11 is a sectional view showing still another embodiment of the scan driving group 1 of the wafer scanning device. The motive power generated by the motor which is placed outside of the vacuum chamber is transmitted to the ball screw 20 via a bevel gear.

Figure 12:
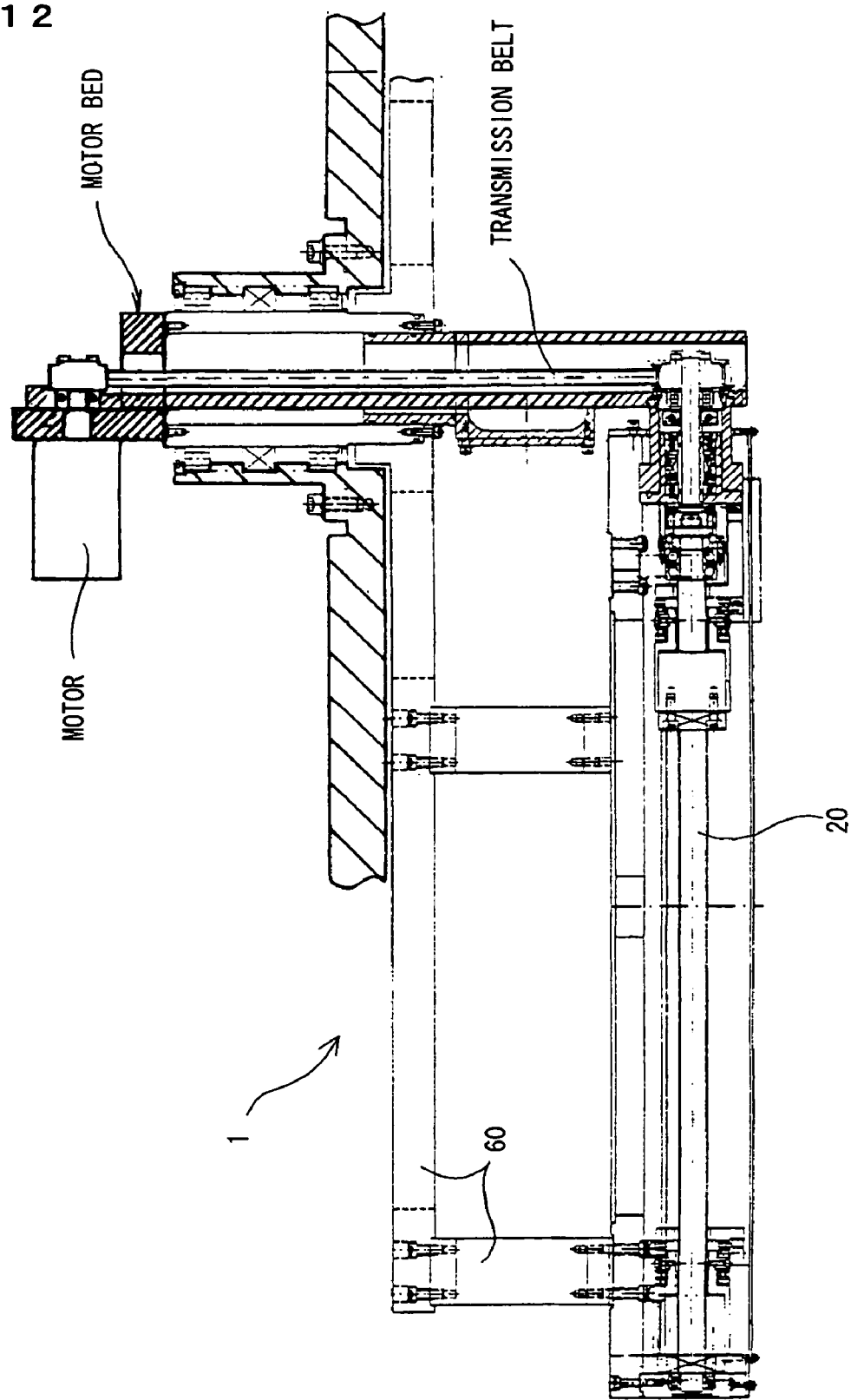
FIG. 12 is a sectional view of still another alternation of the scan driving group 1 of the wafer scanning device.
Figure 13:
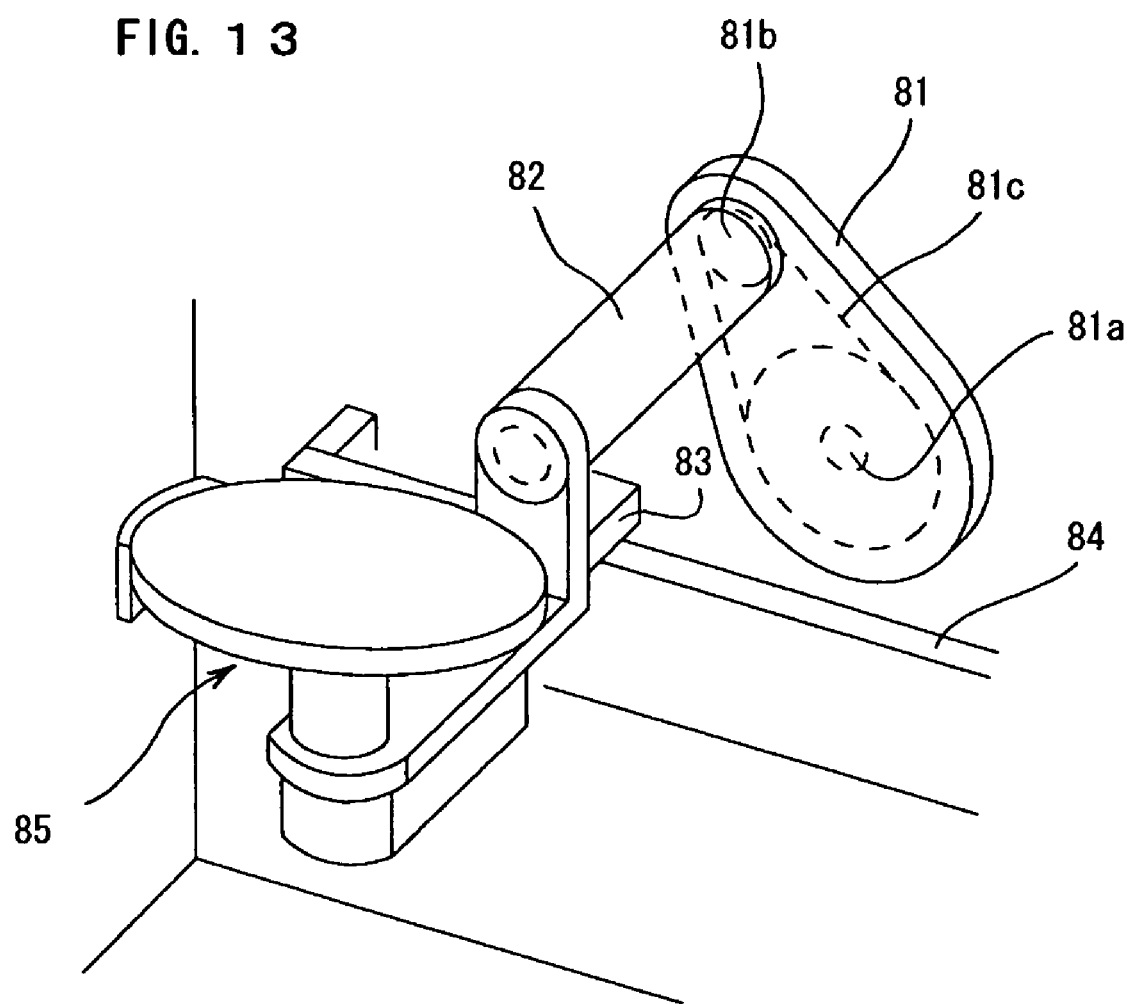
FIG. 13 is a perspective view showing the composition of the conventional and general scan driving group.

FIG. 12 is a sectional view showing still one more other embodiment of the scan driving group 1 of the wafer scanning device. The motive power generated by the motor placed outside of the vacuum chamber is transmitted to the ball screw 20 via a transmission belt.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A wafer scanning device which causes a wafer to scan in a vacuum chamber, comprising:
   a holder which can hold a wafer;
   a linear translation structure which causes the holder to scan;
   a transmission mechanism and a motor which drive the linear translation structure; and
   an integrated support frame which supports them, wherein said holder and said linear translation structure are installed in a vacuum chamber;
   said transmission mechanism comprises a first transmission mechanism on a line of travel of the linear translation structure, which is installed in the vacuum chamber, and a second transmission mechanism offset from said line of travel; and
   said second transmission mechanism and said motor, which has a vacuum-tight cover, are located in the vacuum chamber, and both lead to the atmosphere, with vacuum sealing from the first transmission mechanism.

2. A wafer scanning device according to claim 1 wherein said support frame is supported on a side of the vacuum chamber in such a manner that the support frame can rotate about an axis in the vacuum chamber.

3. A wafer scanning device according to claim 1 wherein said support frame is positioned in the vacuum chamber together with the holder, the linear translation structure, the transmission mechanism and the motor; the support frame has a vacuum-tight cover which is open to the outside of the vacuum chamber via a ventilation pipe and provided with a vacuum seal member along the line of travel of the linear translation structure in order to isolate the interior of the vacuum chamber from the atmosphere; and the second transmission mechanism offset from the line of travel of the linear translation structure and said motor are placed in the vacuum-tight cover which is open to the atmosphere.

4. A wafer scanning device according to claim 3 wherein said support frame is supported by a wall of the vacuum chamber via a hollow rotation shaft including said ventilation pipe in it, and changes its angle by the rotation of said hollow rotation shaft.

5. A wafer scanning device according to claim 3 wherein said transmission mechanism includes a transmission belt which connects the first transmission mechanism on the line of travel of the linear translation structure and the second transmission mechanism offset from the line of travel, and said transmission belt is installed in said vacuum-tight cover.

6. A wafer scanning device according to claim 1 wherein a surface of a wafer held by said holder is parallel to the path of travel of the holder determined by the linear translation structure, said support frame is arranged in such a manner that it can change its angle and can cause the holder to tilt with keeping that condition, and the center line for changing the angle of the support frame is in a plane including the surface of the wafer held by the holder.

7. A wafer scanning device according to claim 1 wherein said support frame is provided with a belt and a pulley to transmit the drive power of the motor to the linear translation structure, and further provided with a linear guide member to guide the movement of the holder.

8. A wafer scanning device according to claim 1 wherein said seal to isolate the interior of the vacuum chamber from the atmosphere can be a magnetic fluid seal which is installed on a rotation shaft directly connected to the linear translation structure.

9. A wafer scanning device according to claim 1 wherein said linear translation structure and other components, having a rolling surface or a sliding surface and installed in the vacuum chamber, are assembled in such a manner that it is possible to exchange them as a unit.

10. A wafer scanning device according to claim 1 wherein the wafer fixed to the holder is caused to scan by means of the linear translation structure while an ion beam is irradiated to the wafer.

11. A wafer scanning device according to claim 1 wherein a first transmission coupling is connected between said transmission mechanism and said motor to drive the linear translation structure.

12. A wafer scanning device according to claim 1 wherein said linear translation structure, which causes the holder to scan, is a ball screw positioned in the vacuum chamber.

13. A wafer scanning device according to claim 12 wherein a rolling surface and a sliding surface of said ball screw are coated with a diamondlike carbon film and further covered by a baking film of fluorine oil.

14. A wafer scanning device according to claim 12 wherein said ball screw is a ball-retainer-embedded ball screw.

15. A wafer scanning device according to claim 12 wherein said ball screw is connected to the transmission mechanism via a second transmission coupling.

16. A wafer scanning device according to claim 12 wherein said ball screw is supported by the support frame via a radial bearing at its either end and further supported by the support frame via a preloaded thrust bearing at its end closer to the transmission mechanism.

17. A wafer scanning device according to claim 16 wherein a fluid passage which cools the ball screw is formed to run near said thrust bearing of the support frame.

* * * * *